(12) United States Patent
Porter et al.

(10) Patent No.: US 6,823,407 B2
(45) Date of Patent: *Nov. 23, 2004

(54) OUTPUT DATA PATH CAPABLE OF MULTIPLE DATA RATES

(75) Inventors: John D. Porter, Meridian, ID (US); William N. Thompson, Meridian, ID (US); Larren Gene Weber, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/357,670

(22) Filed: Feb. 3, 2003

(65) Prior Publication Data

US 2003/0120843 A1 Jun. 26, 2003

Related U.S. Application Data

(63) Continuation of application No. 09/369,515, filed on Aug. 6, 1999.

(51) Int. Cl.[7] ............................ G06F 13/00; G06F 13/14
(52) U.S. Cl. .............................. 710/60; 710/21; 710/38
(58) Field of Search ............................... 710/21, 33, 38, 710/52, 53, 60

(56) References Cited

U.S. PATENT DOCUMENTS

| | | | | |
|---|---|---|---|---|
| 4,463,443 A | * | 7/1984 | Frankel et al. ................. | 710/60 |
| 5,007,012 A | | 4/1991 | Dujari | |
| 5,402,389 A | | 3/1995 | Flannagan et al. ........... | 365/233 |
| 5,506,814 A | | 4/1996 | Hush et al. ............. | 365/230.03 |
| 5,592,488 A | | 1/1997 | Thomann et al. ........... | 370/465 |
| 5,657,289 A | | 8/1997 | Hush et al. ............. | 365/230.05 |
| 5,699,314 A | | 12/1997 | Hush et al. ............. | 365/230.03 |
| 5,703,826 A | | 12/1997 | Hush et al. ............. | 365/230.05 |
| 5,717,647 A | | 2/1998 | Hush et al. ............. | 365/230.05 |
| 5,778,007 A | | 7/1998 | Thomann et al. ........ | 371/40.11 |
| 5,815,447 A | | 9/1998 | Thomann ..................... | 365/200 |
| 5,822,266 A | | 10/1998 | Kikinis ....................... | 365/222 |
| 5,834,813 A | | 11/1998 | Ma et al. ..................... | 257/368 |
| 5,854,800 A | | 12/1998 | Thomann et al. .......... | 371/37.7 |
| 5,875,134 A | | 2/1999 | Cloud ......................... | 365/193 |
| 5,915,128 A | | 6/1999 | Bauman et al. | |
| 5,920,511 A | | 7/1999 | Lee et al. .............. | 365/189.05 |
| 5,923,901 A | | 7/1999 | Kawaura | |

(List continued on next page.)

FOREIGN PATENT DOCUMENTS

| | | | | |
|---|---|---|---|---|
| DE | 19821641 A1 | 7/1999 | ........... | G06F/12/00 |
| DE | 19821641 | 7/1999 | ........... | G06F/12/00 |
| EP | 0778575 | 6/1997 | ............ | G11C/7/00 |
| JP | 11-195296 | 7/1999 | ......... | G11C/11/413 |
| WO | WO-99/50852 | 10/1999 | ............ | G11C/7/00 |

OTHER PUBLICATIONS

"Increasing Data Read Rate from Memories", *IBM Technical Disclosure Bulletin*, 30, (May, 1988), 339–341.

*Primary Examiner*—Rehana Perveen
(74) *Attorney, Agent, or Firm*—Schwegman, Lundberg, Woessner & Kluth, P.A.

(57) ABSTRACT

Systems, data paths and methods of transferring data. By utilizing the systems, data paths, and methods, data can be transferred at a single or double rate. One embodiment of the present invention provides a system having a data unit, an output register, and a holding register. The output register is coupled to the data unit. The holding register is coupled to the data unit and the output register. Data from the data unit is passed to the output register and the holding register substantially simultaneously and data from the holding register is then passed to the output register. Data can be output from the output register.

43 Claims, 9 Drawing Sheets

U.S. PATENT DOCUMENTS

| | | | |
|---|---|---|---|
| 5,953,258 A | 9/1999 | Thomann | 365/189.01 |
| 5,963,469 A | 10/1999 | Forbes | 365/149 |
| 5,986,948 A | 11/1999 | Cloud | 365/193 |
| 6,060,916 A | 5/2000 | Park | 327/99 |
| 6,067,585 A * | 5/2000 | Hoang | 710/11 |
| 6,112,267 A | 8/2000 | McCormack et al. | |
| 6,118,729 A | 9/2000 | Hirabayashi et al. | |
| 6,151,271 A * | 11/2000 | Lee | 365/233 |
| 6,314,042 B1 | 11/2001 | Tomishima et al. | |
| 6,446,180 B2 | 9/2002 | Li et al. | 711/167 |
| 6,477,107 B1 * | 11/2002 | Lee | 365/233 |
| 6,477,592 B1 | 11/2002 | Chen et al. | 710/52 |
| 6,522,599 B2 | 2/2003 | Ooishi et al. | 365/233 |

\* cited by examiner

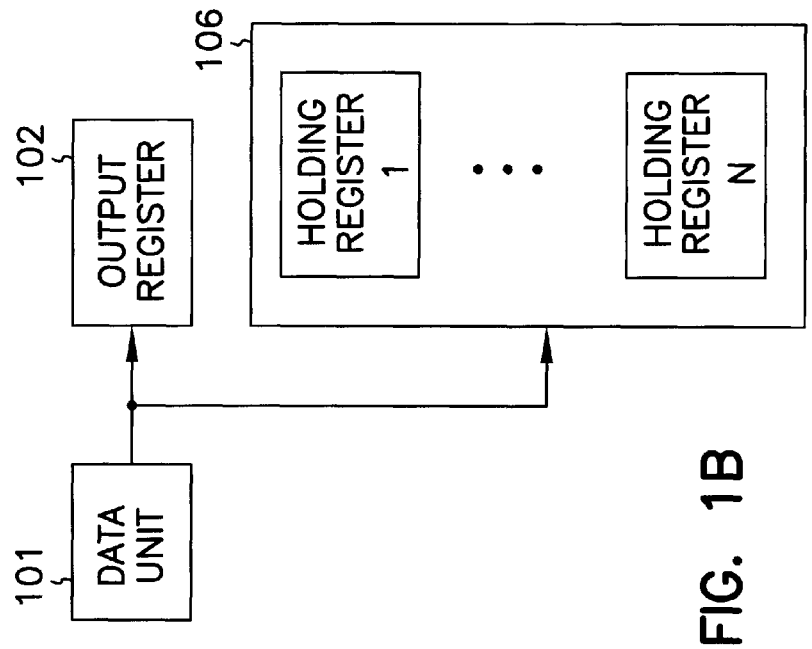
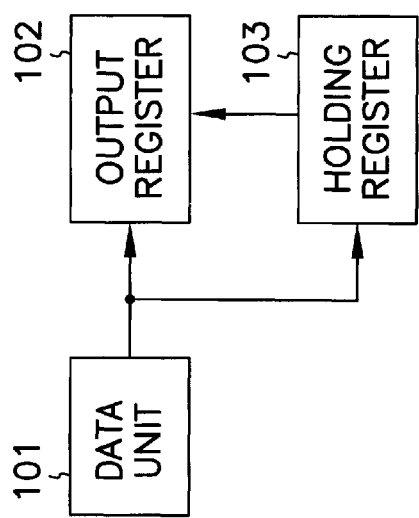

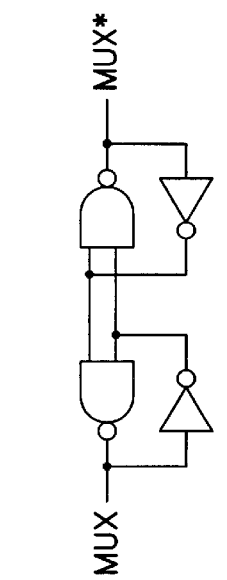
FIG. 3D
FIG. 3C
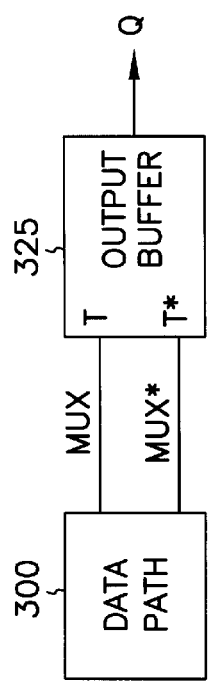
FIG. 3B

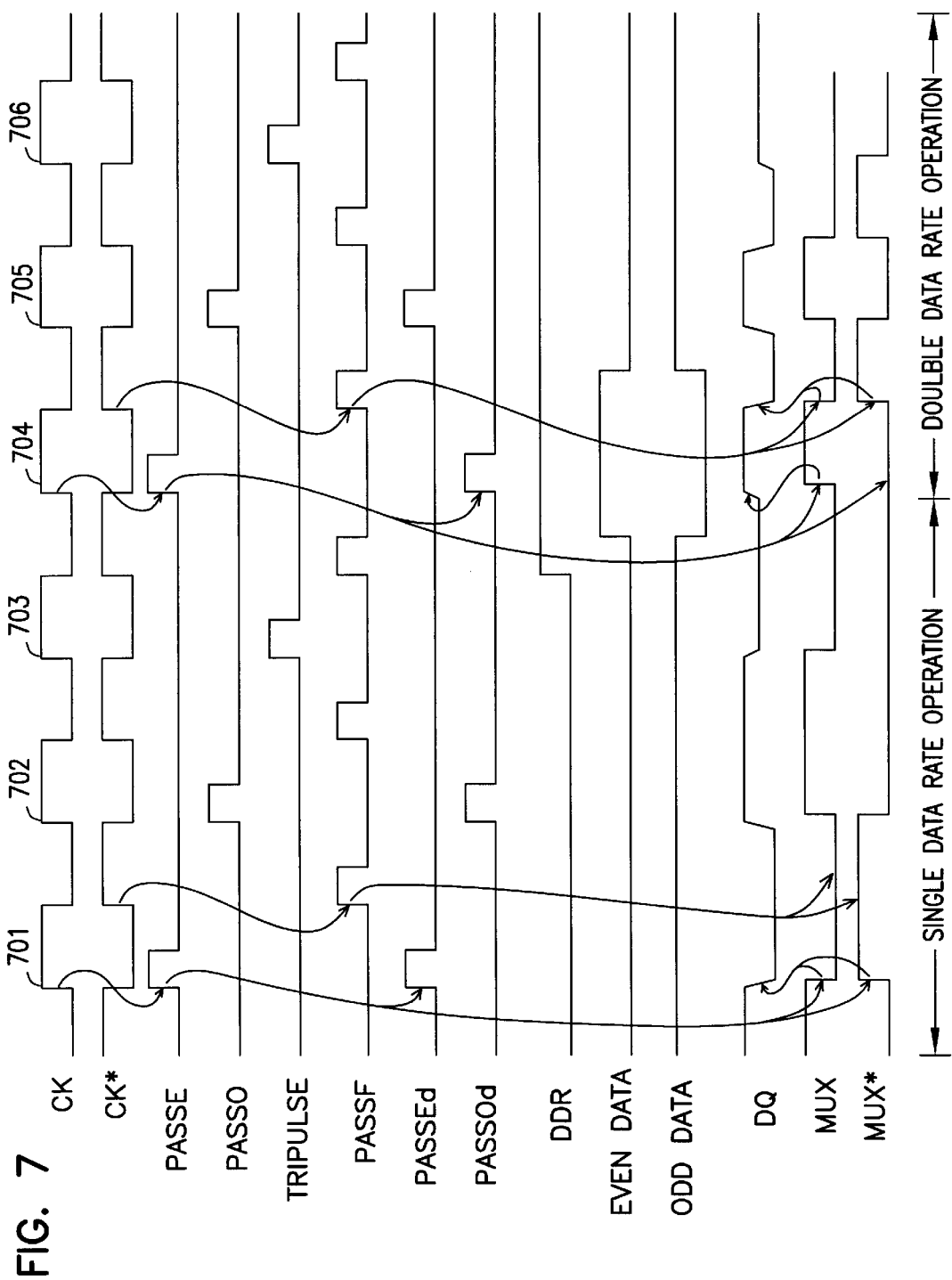

OUTPUT DATA PATH CAPABLE OF MULTIPLE DATA RATES

This application is a Continuation of U.S. application Ser. No. 09/369,515, filed Aug. 6, 1999, which is incorporated herein.

FIELD OF THE INVENTION

This invention relates generally to data paths, and more particularly to output data paths capable of single or double data rates.

BACKGROUND OF THE INVENTION

The speed of transferring data in a computer system is often a major component in overall system performance. The faster data can be transferred from one component to another, the faster the system is. This data transfer rate can create a severe bottleneck for system performance.

Memory devices and circuits are components in systems that desire a fast data transfer rate. Memory devices have a data path for transferring data. Memory circuits are vital components in computer and other systems which require permanent or temporary data storage. The memory circuits such as dynamic random access memory (DRAM) are used in systems such as a microprocessor system. The speeds and volume of data used in these systems has increased, causing an increased need for memory circuits. The amount of data that can be written or read over a set period of time is critical. Memory is often a critical component of various computer related systems. By increasing the speeds at which data can be accessed, the speeds of those systems can be increased.

In a processor based system, a processor operates at a certain frequency. Ideally, memory devices would operate at the same frequency as the processor. However, memory devices do not operate at the same speed as the processor due to the high cost involved. Memory devices generally operate at a fraction of the speed of the processor and cause the system to run slower.

In processing systems, operation speeds of dynamic random access memories used as main memories have been increased, but are still low compared with operation speeds of microprocessors. This relatively low speed increases the wait time of the microprocessor, and impedes fast processing, as an access time and a cycle time of the DRAM form a bottleneck in a whole system performance.

One way that memory circuits can be made to write and read data faster is to build the memory circuits so they operate at a higher clock frequency and transfer data at a faster rate. This has been done in microprocessors as can be seen by the increase in operating frequency in microprocessors. For example, a microprocessor running at 200 Mhz is generally much faster than a microprocessor running at 50 Mhz. However, by operating circuits at higher operating frequency, additional problems are encountered. For example, the amount of heat produced and power used by a circuit operating at a higher frequency can be greatly increased. This corresponds to high cost solutions to handle the heat and power problems. Furthermore, the increased use of portable devices, such as laptop computers, requires that power use by circuits be reduced. Also, the higher operating frequency can cause integrated circuit die to be more expensive.

Since memory devices are used in many different systems, increasing the speed of memory devices without significantly increasing the cost of memory devices can allow everything from wordprocessors to automatic teller machines to perform their tasks quicker.

Other system components also use data paths to transfer data. If these data paths can transfer data faster, the overall performance of the system can increase. Data paths can be used to transfer data from a data array or a hard drive.

For the reasons stated above, and for other reasons stated below which will become apparent to those skilled in the art upon reading and understanding the present specification, there is a need in the art for double data rate data paths and methods of transferring data at double data rates.

SUMMARY OF THE INVENTION

One embodiment of the present invention provides a system having a data unit, an output register, and a holding register. The output register is coupled to the data unit. The holding register is coupled to the data unit and the output register. The system can transfer data at a single rate or double rate.

Another embodiment of the invention provides a method for transferring data. A first piece of data is passed to an output register. A second piece of data is passed to a holding register. The second piece of data is passed from the holding register to the output register.

Other embodiments are described and claimed.

BRIEF DESCRIPTION OF THE DRAWINGS

In the drawings, where like numerals refer to like components throughout the several views, FIG. 1A is a block diagram of one embodiment of a data path;

FIG. 1B is a block diagram of one embodiment of a data path;

FIG. 3B is a block diagram of one embodiment of a data path and an output buffer;

FIG. 3C is a truth table of one embodiment of an output buffer;

FIG. 3D is a block diagram of one embodiment of a register;

FIG. 7 is a timing diagram of one embodiment of a data path.

DETAILED DESCRIPTION OF THE INVENTION

Figure 1C:
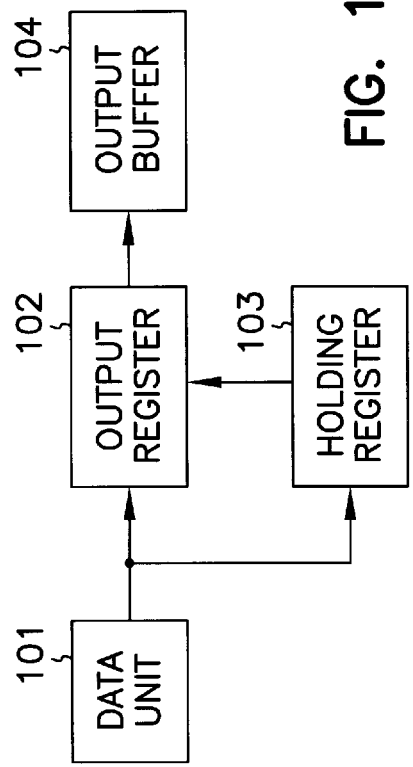
FIG. 1C is a block diagram of one embodiment of a data path.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

This invention includes an output data path that is capable of multiple data rates. By transferring data at a double data rate, twice the amount of data can be transferred in the same amount of time as transferring data at a single rate. Some applications using data paths may want to operate at a single data rate while other applications may want to operate at double data rate. A user can change the rate from double to single or single to double on the fly without the timing changing. In some implementations, a single data pin (DQ) will drive one bit per cycle off of the rising edge of a clock in single data rate operation and it will drive two bits, one off the rising edge and one off the falling edge of a clock in double data rate operation. Alternately, a complement clock can be generated that is the complement of the clock. Then, two bits per cycle can be driven, one off the rising edge of the clock and one off the rising edge of the complement clock. Operating in double data rate allows twice the data to be transferred for the same speed. During double data rate operation, one data line is passed to an output register while at the same time the other data line is passed to a holding register. During single data rate operation, the same data line is passed to the output register as well as the holding register so that the same data is driven on both edges of a clock.

This invention can also be used in any system or device where there is a bandwidth issue. For example, it can be used with a disk drive, SRAM (static random access memory), and DRAM (dynamic random access memory).

Referring to FIG. 1A, a data path according to an embodiment of the invention is shown. The data path includes a data unit 101, output register 102, and a holding register 103.

The data unit 101 can be a system or device that stores data. The data unit will typically be a memory cell, memory block or memory array but may also be a disk drive.

The output register 102 is coupled to the data unit 101. The output register can be implemented as a pair of data lines with a keeper latch. The output register 102 can also be implemented in other ways. A first piece of data is passed from the data unit 101 to the output register 102 on a rising edge of a clock.

The holding register 103 is coupled to the data unit 101 and the output register 102. The holding register 103 can be implemented as a pair of data lines with a keeper latch. The holding register 103 can also be implemented in other ways. A second piece of data is passed from the data unit to the holding register 103 on the rising edge of the clock. In single data rate operation, the second piece of data is the same as the first piece of data, representing the same memory location. In double data rate operation, the second piece of data is different than the first piece of data, representing a different memory location. The second piece of data is passed to the output register on a falling edge of the clock.

In an alternate embodiment, the first piece of data is passed from the data unit 101 to the output register 102 on a first event and the second piece of data is passed from the data unit 101 to the holding register 103 on the first event and the second piece of data is passed from the holding register 103 to the output register 102 on a second event. The first and second events can be signals, different clocks, or different clock edges.

Referring to FIG. 1B, a data path according to an embodiment of the invention is shown. The data path includes a data unit 101, output register 102, and a plurality of holding registers 106.

The data unit 101 can be a system or device that stores data. The data unit will typically be a memory cell, memory block or memory array but may also be a disk drive.

The output register 102 is coupled to the data unit 101. The output register can be implemented as a pair of data lines with a keeper latch. A first piece of data is passed from the data unit 101 to the output register 102.

The plurality of holding registers 106 are coupled to the data unit 101 and the output register 102. Each holding register may be implemented as a pair of data lines with a keeper latch. A plurality of second pieces of data are passed from the data unit 101 to the plurality of holding registers 106 at substantially the same time as the first piece of data is passed from the data unit 101 to the output register 102. The plurality of second pieces of data are then passed from the plurality of holding registers 106 to the output register 102 such that the plurality of second pieces of data are passed to the output register 102 within the same clock cycle or over multiple cycles.

The passing of the plurality of second pieces of data from the plurality of holding registers 106 to the output register can be done a number of ways. Each of the second pieces can be passed by various signals or inputs, dividing a clock or by passing the pieces on different phases of a clock. For example, if there are ten holding registers passing ten pieces of data, ten additional signals could be used to pass the ten pieces of data in one cycle.

In another embodiment, the data path includes an output buffer 104 as shown in FIG. 1C. The output buffer 104 is connected to the output register 102.

Figure 1D:
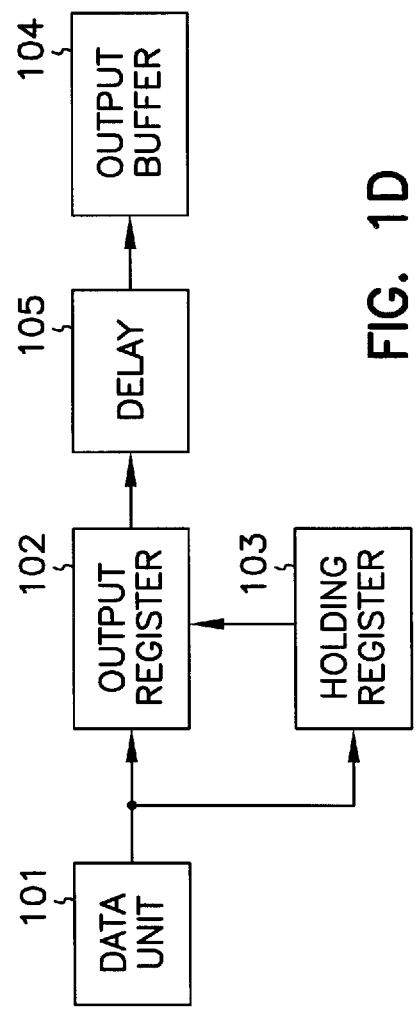
FIG. 1D is a block diagram of one embodiment of a data path.

In another embodiment, the data path includes an output buffer 104 and a delay unit 105 as shown in FIG. 1D. The output buffer 104 is connected to the delay unit 105 which is connected to the output register 102. The delay unit 105 allows offsetting or delaying a piece of data before it is sent to the output buffer 104.

Figure 2:
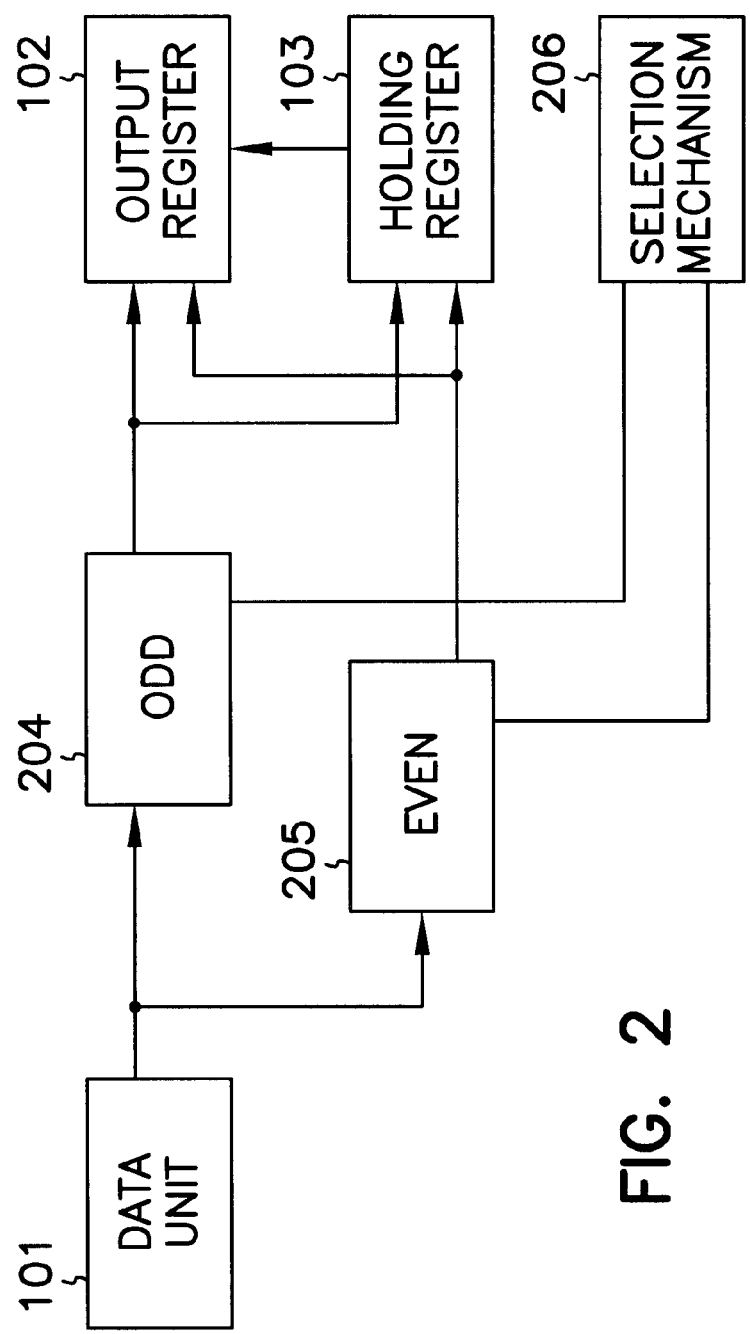
FIG. 2 is a block diagram of one embodiment of a data path.

Referring to FIG. 2, a data path according to an embodiment of the invention is disclosed. The data path includes a data unit 101, an odd path 204, an even path 205, an output register 102, selection mechanism 206, and a holding register 103.

The data unit 101 can be any system or device that stores data. For example, the data unit may be a disk drive or a data array.

The odd path 204 is connected to the data unit 101. The odd path 204 may select data with an odd address or stored in odd numbered locations. The term "ODD DATA" refers to this data accessed by the odd path 204. The odd path 204 does not refer to only accessing data with odd values.

The even path 205 is connected to the data unit. The even path 205 may select data with an even address or stored in even numbered locations. The term "EVEN DATA" refers to the data with an even address or stored in even numbered locations. Other implementations may use different ways of selecting data in the data unit 101. For example, the even path 205 could select the last half of data in the data unit 101 while the odd path 204 could select the first half of data in the data unit 101.

The output register 102 is coupled to the odd path 204 and the even path 205. The output register 102 can be implemented as a pair of data lines with a keeper latch. A first piece of data is passed from the data unit 101 through the odd path 204 or even path 205 to the output register 102 on a rising edge of a clock. The first piece of data can be EVEN DATA or ODD DATA.

The holding register 103 is coupled to the odd path 204, the even path 205 and the output register 102. The holding register 103 can be implemented as a pair of data lines with a keeper latch. A second piece of data is passed from the data unit through the odd path 204 or even path 205 to the holding register 103 on the rising edge of the clock.

In single data rate operation, the second piece of data is the same as the first piece of data and the second piece of data represents the same memory address or location as the first piece of data. The data selected by the odd path 204 or the even path 205 is passed to the output register 102 and the holding register 103 substantially simultaneously. The data is passed on the rising edge of the clock, but there may be a small delay in passing the data to the holding register 103.

In double data rate operation, the second piece of data is a different piece than the first piece of data. If the first piece of data is EVEN DATA then the second piece of data is ODD DATA. If the first piece of data is ODD DATA then the second piece of data is EVEN DATA. The second piece of data is then passed from the holding register 103 to the output register 102 on a falling edge of the clock.

In one embodiment, the data path may include a select pin or selection mechanism 206. The selection mechanism 206 is connected to the data path and allows selection of single or double data rate operation. The selection mechanism 206 can select which data is passed (ODD DATA or EVEN DATA).

Figure 3A:
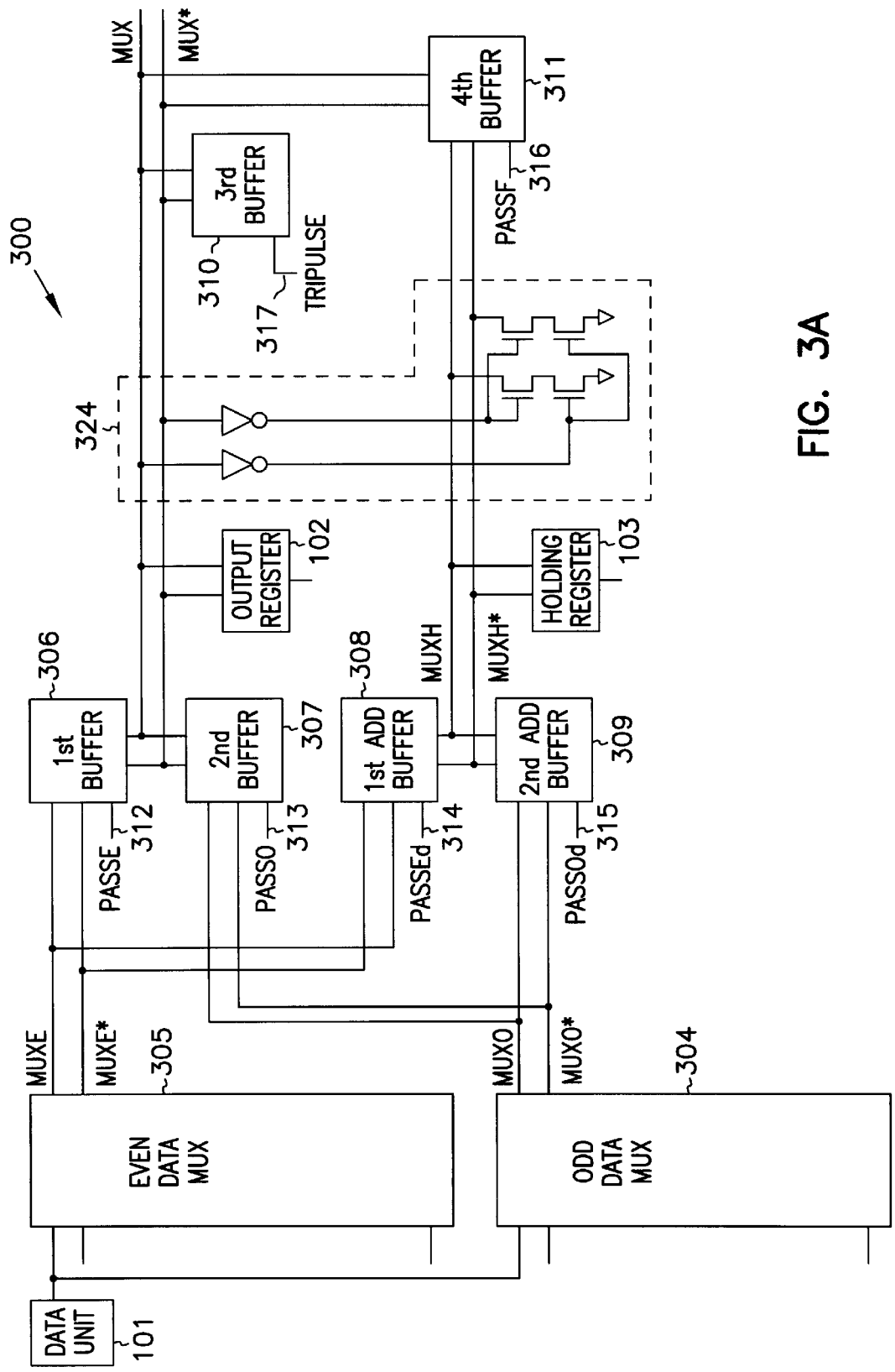
FIG. 3A is a block diagram of one embodiment of a data path.

Referring to FIG. 3A, an output data path 300 according to an embodiment of the invention is disclosed. The data path includes a data unit 101, an even mux 305, an odd mux 304, a first buffer 306, a second buffer 307, a first additional buffer 308, a second additional buffer 309, a third buffer 310, a fourth buffer 311, an output register 102, a holding register 103, a zero detector 324, a PASSO signal 313, a PASSE signal 312, a PASSOd signal 315, a PASSEd signal 314, a PASSF signal 316, and a TRIPULSE signal 317.

A buffer is a circuit that may condition a signal, such as data, that is sent along a line. A tristate buffer is a buffer which can drive its output to a 0, 1, or a tristate. A tristate buffer is prevented from passing data if it is tristated.

The data unit 101 can be any system or device that stores data. Typically, the data unit is a memory block, memory array or a memory cell. The data unit 101 may include control circuitry to allow data to be accessed more than once per clock cycle. The data unit 101 may also be a disk drive.

The odd mux 304 is connected to the data unit 101. The odd mux 304 may select data with an odd address or stored in odd numbered locations. The term ODD DATA refers to this data selected by the odd mux 304. The odd mux 304 does not refer to only selecting data with odd values.

The even mux 305 is connected to the data unit 101. The even mux 305 may select data with an even address or stored in even numbered locations. The term EVEN DATA refers to the data with an even address or stored in even numbered locations. Other implementations may use different ways of providing multiple connections to the data unit 101.

The even mux 305 and odd mux 304 can be part of even or odd paths. Each one provides a preliminary level of muxing that is separate from one another and separate from the muxing that occurs with the tristate buffers, the output register 102, and the holding register 103. A number of data lines may be presented to each mux. A list of possible data lines are: multiple data bits (if the internal data path is wider than necessary), redundant data, and buffered write data. Which data line is selected is determined by peripheral logic. Each data mux provides the correct data (the even mux 305 provides EVEN DATA and the odd mux 304 provides ODD DATA).

The first buffer 306 is connected to the even mux 305. The first buffer 306 is a tristateable buffer. The first buffer 306 passes EVEN DATA from the data unit 101 that has passed through the even mux 305 to the output register 102. A PASSE signal pulse 312 signals the first buffer 306 to pass EVEN DATA on the rising edge of the clock. If the PASSE signal 312 is fired, the PASSO signal 313 and the TRIPULSE signal 317 are not fired.

The second buffer 307 is connected to the odd mux 304. The second buffer 307 is a tristateable buffer. The second buffer 307 passes ODD DATA from the data unit 101 that has passed through the odd mux 304 to the output register 102. A PASSO signal pulse 313 signals the second buffer 307 to pass ODD DATA on the rising edge of the clock. If the PASSO signal 313 is fired, the PASSE signal 312 and the TRIPULSE signal 317 are not fired.

The output register 102 is coupled to the first buffer 306 and the second buffer 307. The output register 102 can be implemented as a pair of data lines with a keeper latch. One such implementation of an output register is shown in FIG. 3D.

The third buffer 310 is connected to the output register 102. The third buffer 310 is a tristateable buffer. The third buffer 310 can place double zeros on the output register 102. The third buffer 310 can only pass a double zero to the output register 102. By placing double zeros on the output register 102 and having a dual zero detector 324 detect the double zeros, a double zero is placed in the holding register 103 as well. A double zero is a zero on MUX and MUX*. A TRIPULSE signal 317 is connected to the third buffer 310 to signal when to place the double zeros on the output register 102. The TRIPULSE signal 317 operates on rising clock edges in response to a user selection. If the TRIPULSE signal 317 is fired, the PASSO 313 and PASSE 312 signals are not fired.

The first additional buffer 308 is connected to the even mux 305. The first additional buffer 308 is a tristateable buffer. The first additional buffer 308 passes EVEN DATA from the data unit 101 that has passed through even mux 305 to the holding register 103. A PASSEd signal pulse 314 signals the first additional buffer 308 to pass EVEN DATA on the rising edge of the clock to the holding register 103. The PASSEd signal 314 is a slightly delayed version of the PASSE signal 312 or the PASSO signal 313.

The second additional buffer 309 is connected to the odd mux 304. The second additional buffer 309 is a tristateable buffer. The second additional buffer 309 passes ODD DATA from the data unit 101 that has passed through the odd mux 304 to the holding register 103. A PASSOd signal pulse 315 signals the second additional buffer 309 to pass ODD DATA on the rising edge of the clock to the holding register 103. The PASSOd signal 315 is a slightly delayed version of the PASSO signal 313 or the PASSE signal 312.

In single data rate operation, the PASSOd and PASSEd signals are sent when the respective PASSO and PASSE signals are sent thereby passing the same piece of data to the holding register 103 and the output register 102. In double data rate operation, the PASSOd and PASSEd signals are sent when the respective PASSE and PASSO signals are sent thereby passing EVEN DATA to the holding register 103 when ODD DATA is passed to the output register 102 and passing ODD DATA to the holding register 103 when EVEN DATA is passed to the output register 102.

The holding register 103 is coupled to the first additional buffer 308, the second additional buffer 309 and the fourth buffer 311. The holding register can be implemented as a pair of data lines with a keeper latch. One such implementation of an output register is shown in FIG. 3D. A second piece of data is passed from the data unit 101 to the holding register 103 on the rising edge of the clock. The second piece of data is EVEN DATA or ODD DATA. In single data rate operation, the second piece of data is the same as the first piece of data. The data is passed on the rising edge of the clock, but there may be a small delay in passing the data.

The fourth buffer 311 is coupled to the holding register 103 and the output register 102. The fourth buffer 311 passes data from the holding register 103 to the output register 102 on a falling edge of the clock. A PASSF signal 316 coupled to the fourth buffer 311 signals the fourth buffer 311 to pass the data. The PASSF signal 316 is sent to the fourth buffer 311 on every falling edge of the clock.

Generally, the signals sent to buffers are pulses.

In one embodiment, an output buffer 325, as shown in FIGS. 3B and 3C, may be connected to the output register 102 of data path 300 to pass on data to other system devices. The output buffer has a true and a bar input so that it is capable of three outputs, a "1", a "0", and a tristate condition. A "1" presented on the true input of the output buffer would turn on a pullup, while a "0" presented on the true input of the output buffer would turn off the pullup. The bar input controls the pulldown in a similar fashion, so the buffer is capable of a "0", "1", and a tristate condition. If a double zero is presented to the output buffer 325, the output buffer places it's output in a high impedance state. This can allow multiple data paths to be tied together by using one data path and having other data paths in high impedance states.

Figure 4:
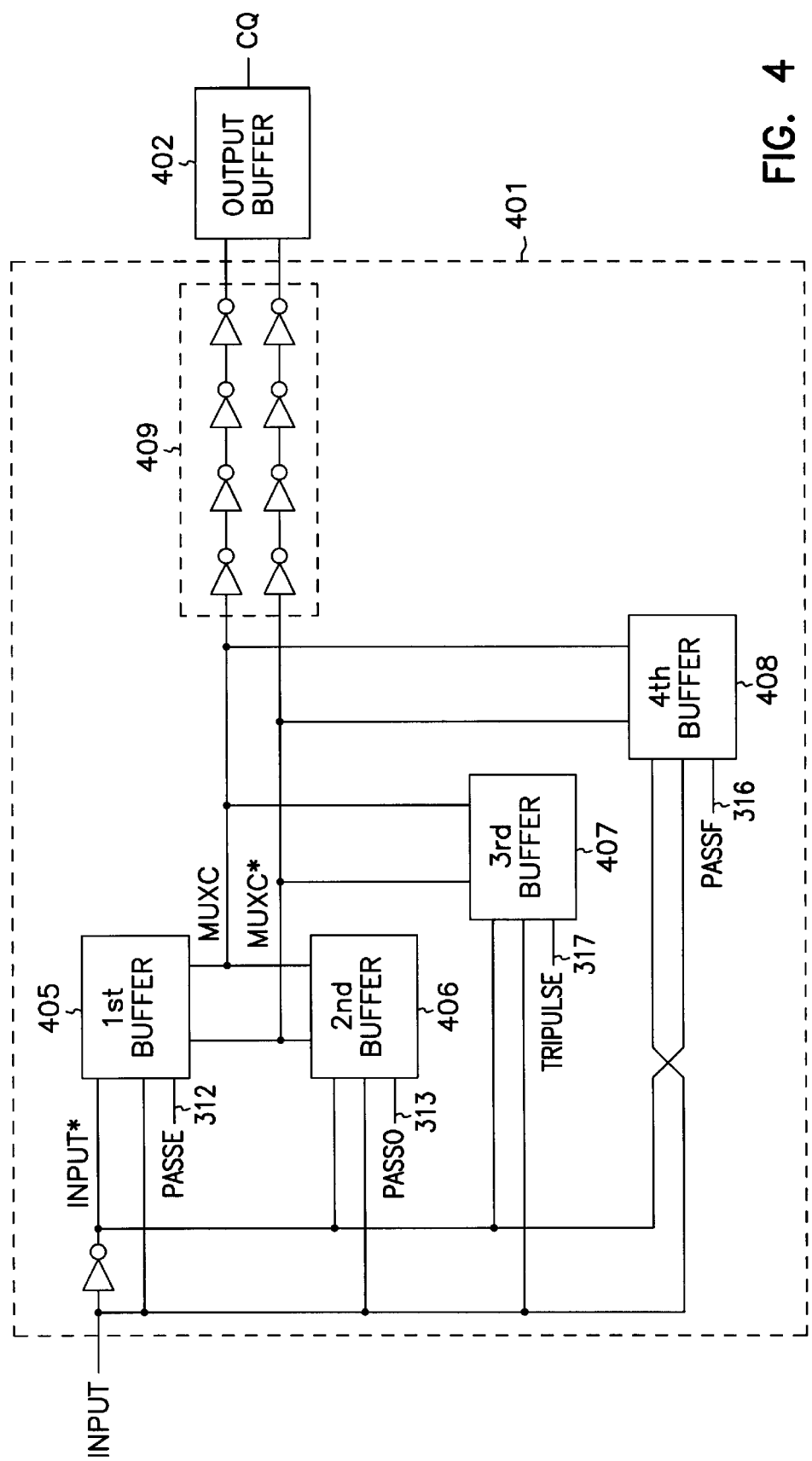
FIG. 4 is a block diagram of one embodiment of an echo clock.

FIG. 4 shows an echo clock 401 coupled to an output buffer 402. An echo clock may be used to indicate when data is valid and facilitate data capture. A true and a false echo clock can be generated. A true echo clock can be achieved by tying an input to VCC and a false echo clock by tying an input to ground. The echo clock 401 includes a first buffer 405, a second buffer 406, a third buffer 407 and a fourth buffer 408. The first buffer 405 is coupled to the input, a pair of data lines, and a PASSE signal 312. The pair of data lines are shown by MUXC and MUXC*. MUXC* is generally the complement of MUXC. The first buffer 405 passes the input to the pair of data lines when signaled by the PASSE signal 312. The second buffer 406 is coupled to the input, the pair of data lines, and the PASSO signal 313. The second buffer 406 passes the input to the pair of data lines when signaled by the PASSO signal 313. The third buffer 407 is coupled to the input, the pair of data lines, and a TRIPULSE signal 317. The third buffer 408 passes the input to the pair of data lines when signaled by the TRIPULSE signal 317. The fourth buffer 408 is coupled to the complement of the input, the pair of data lines, and PASSF signal 316. The fourth buffer passes the complement of the input to the pair of data lines when signaled by the PASSF signal. The echo clock 401 may include delay circuitry 409 connecting the pair of data lines to the output buffer 402. The delay circuitry 409 allows adjustments to be made to the timing of data output.

The echo clock closely tracks the data path 300. The same signals (PASSE, PASSO, TRIPULSE, and PASSF) for the echo clock are used for the data path 300 so that data is only passed on those signals.

Figure 5A:
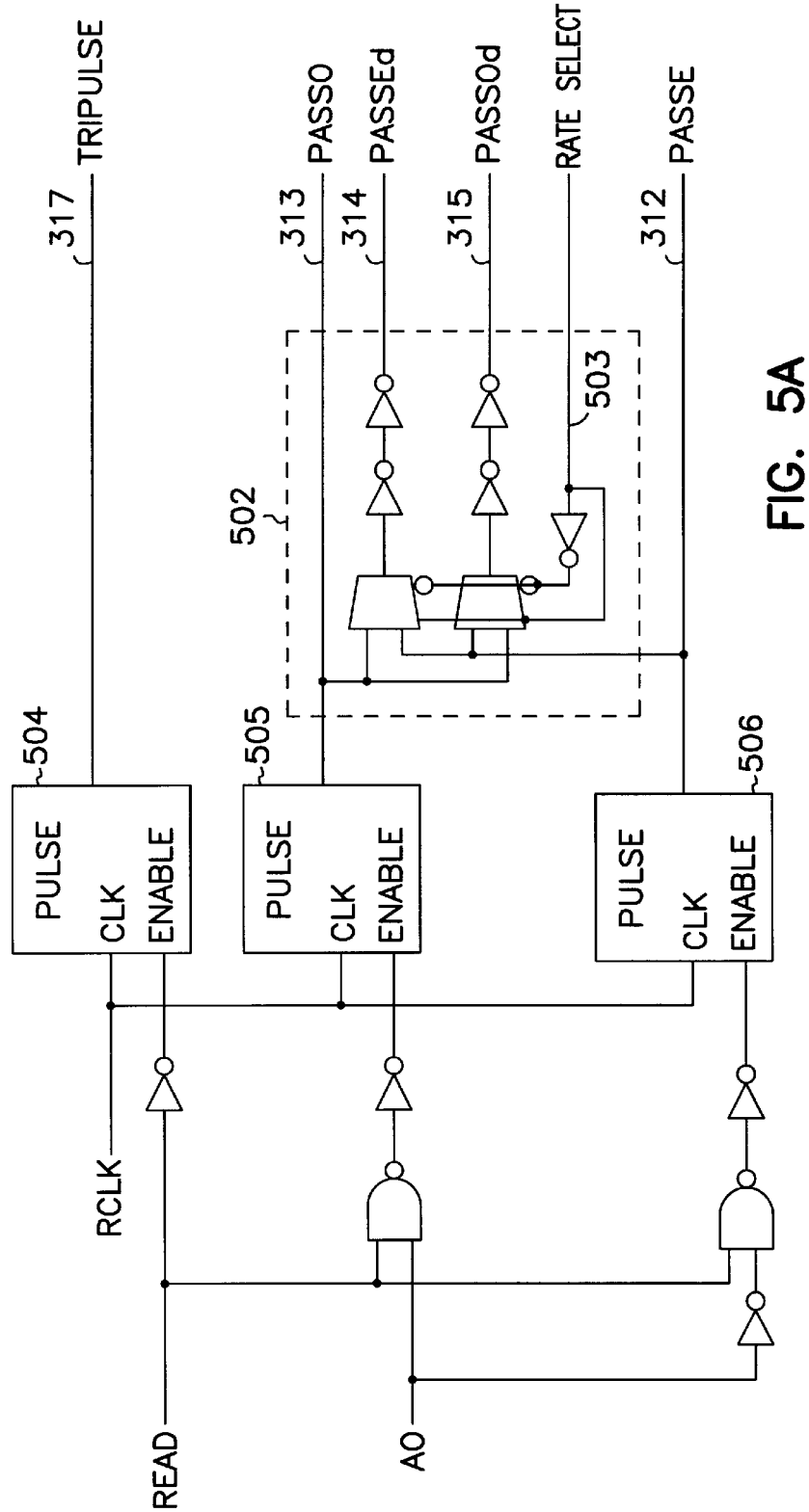
FIG. 5A is a block diagram of one embodiment of a pulse generator.
Figure 5B:
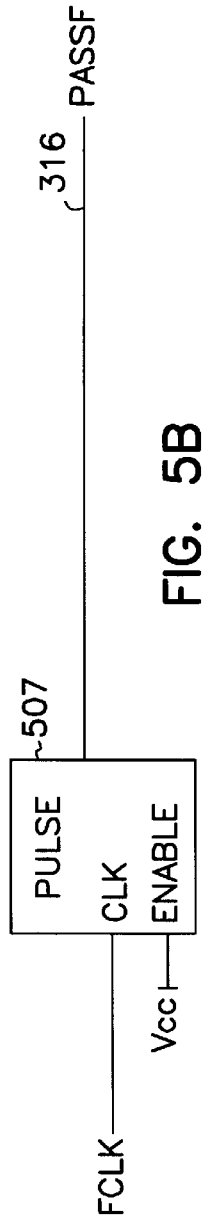
FIG. 5B is a block diagram of one embodiment of a pulse generator.

FIGS. 5A and 5B disclose a pulse generator according to an embodiment of the invention. The pulse generator includes a first pulse generator 504, a second pulse generator 505, a third pulse generator 506, a fourth pulse generator 507, rate select logic 502, rate select line 503, TRIPULSE signal 317, PASSO signal 313, PASSE signal 312, PASSOd signal 315, PASSEd signal 314, and a PASSF signal 316.

The first pulse generator 504 generates the TRIPULSE signal 317 on command by a user. Generally, the TRIPULSE signal 317 is generated when the READ signal is not being asserted so that data is not output when it is not being read. One input of the first pulse generator is a RCLK (rising edge clock). The RCLK can simply be a system clock.

The second pulse generator 505 generates the PASSO signal 313. One input of the second pulse generator 505 is the RCLK. The third pulse generator 506 generates the PASSE signal 312. One input of the third pulse generator 506 is the RCLK. The selection of which pulse is generated on a given clock cycle, PASSO 313 or PASSE 312, depends on A0 which determines between odd or even locations. A0 can be the lowest order address.

The rate select logic 502 is connected to the rate select line 503 and the PASSE 312 and the PASSO 313 signals. The rate select logic 502 creates a delayed version, PASSEd 314 or PASSOd 315 of the PASSE 312 or PASSO 313 signals in response to the rate select line. The rate select line 503 is used for selecting single or double data rate. The rate select line 503 can have one state for single data rate and one state for double data rate such as being low for single rate and high for double data rate. The rate select line 503 is user selectable. If the rate select line corresponds to single data rate operation, a PASSEd 314 or PASSOd 315 signal is generated in response to a PASSE 312 or PASSO 313 signal being generated, respectively. If the rate select line corresponds to double data rate operation, a PASSEd signal 314 is generated in response to a PASSO signal 313 instead of in response to a PASSE signal 312 and a PASSOd signal 315 is generated in response to a PASSE signal 312 instead of in response to a PASSO signal 313.

The fourth pulse generator 507 generates the PASSF signal 316. One input of the fourth pulse generator 507 is a FCLK (falling edge clock). The FCLK is the complement of the RCLK. The PASSF signal 316 is generated on falling edges of the clock.

Figure 6:
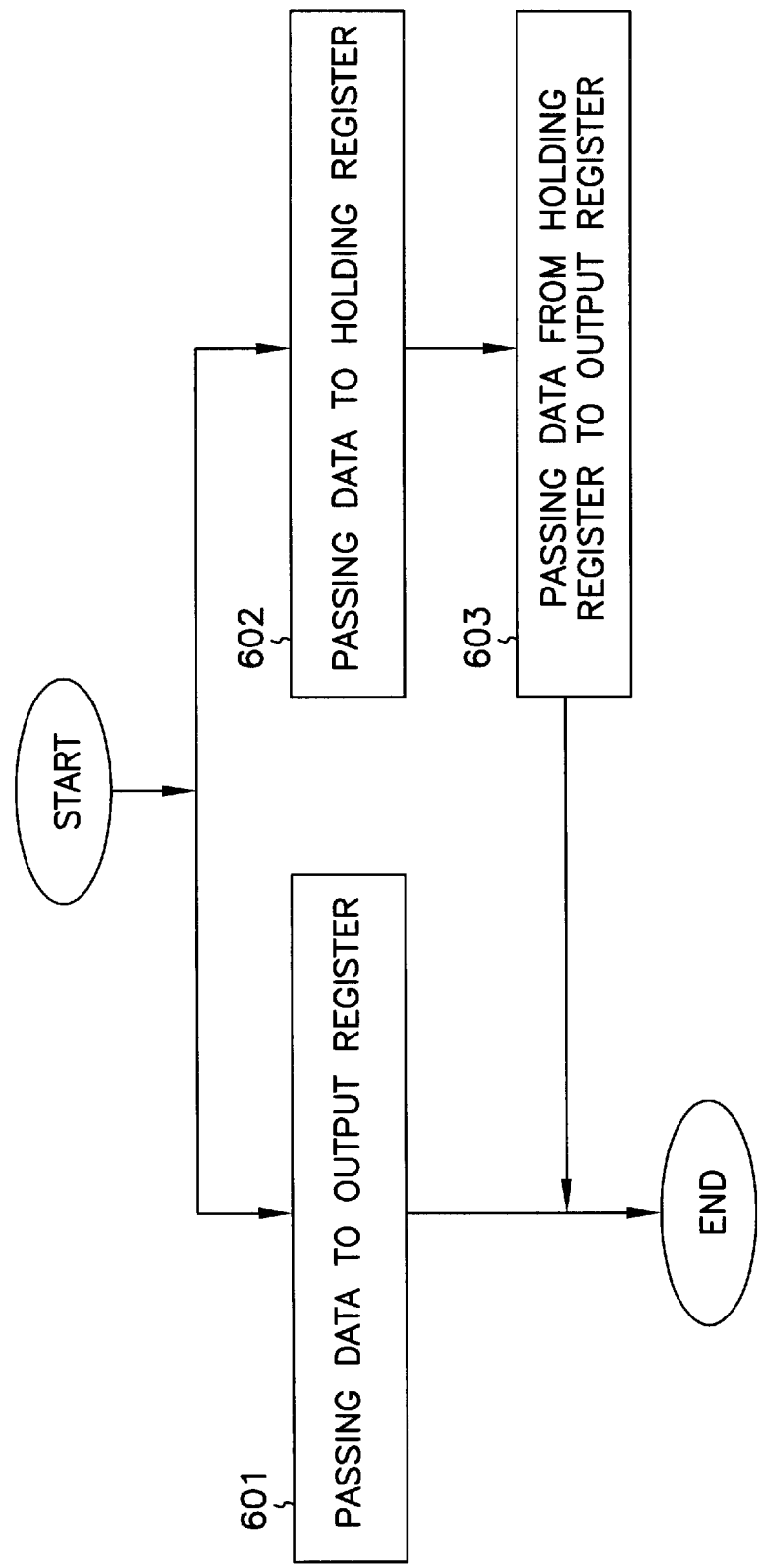
FIG. 6 is a flowchart of one embodiment of a method for transferring data.

FIG. 6 discloses a method for transferring data according to an embodiment of the invention.

A first piece of data is passed to an output register (601). The first piece of data can be a bit or any other amount of data for example, a word or block of data. The data is generally passed on a rising edge of a clock.

A second piece of data is passed to a holding register (602). The second piece of data can be a bit or any other amount of data. The second piece of data is generally passed substantially simultaneous to the passing of the first piece of data. There may be a small delay which is usually much less than a half of a clock cycle. The delay may be necessary to permit the second piece of data to be read from a data unit without slowing down the passing of the first piece.

The second piece of data is passed from the holding register to the output register (603). This generally occurs on a falling edge of the clock. In single data rate mode, the second piece of data will be the same as the first piece of data so the output register will contain the same data on the rising and falling edges of the clock. In double data rate mode, the second piece of data will be another piece of data from the data unit. Any number of pieces of data can be transferred with this method.

Another embodiment of this method includes passing the first or second piece of data to an output buffer. The data is passed from the output register to the output buffer. The data may be used by processors or other devices.

Another embodiment of the invention is a method for transferring data having EVEN DATA and ODD DATA. The term EVEN DATA refers to the data with an even address, stored in even numbered locations, an even sequence, a first half, range or portion. The term ODD DATA refers to the data with an odd address, stored in odd numbered locations, an odd sequence, a second half, range or portion. The terms EVEN DATA and ODD DATA do not refer to data with even or odd values.

EVEN DATA is passed from a data unit to an output register or a holding register. ODD DATA is passed from a data unit to an output register or a holding register. The data is generally passed on the rising edge of a clock. However, the data passed to the holding register may be delayed from the data passed to the output register.

Data from the holding register is passed to the output register. The data passed to the output register from the holding register is the data residing in the holding register. This data is generally passed on the falling edge of the clock.

Referring to FIG. 7, a timing diagram is shown for one embodiment of the invention. The first half of the timing diagram (701–703) is single data rate operation and the second half (704–706) is double data rate operation. The term EVEN DATA refers to the data with an even address, stored in even numbered locations, or in an even sequence. The term ODD DATA refers to the data with an odd address, stored in odd numbered locations, or in an odd sequence. The EVEN DATA and ODD DATA are connected to the buffers and can be selected by multiplexors. DQ (data pin) is the data from the output buffer 325. MUX and MUX* are the data lines for the output register 102.

On the first rising edge of CK (clock) 701, PASSE (a pulse) is generated and sent to a first buffer 306. Pulses are used so that when data is driven, it can be driven unencumbered as all other buffers are tristated and only the output register 102 is holding data. The output register is comprised of a keeper latch that is easy to overpower by the buffers. PASSE is a pulse so that the first buffer 306 passes the data and turns back off so that when PASSF subsequently signals and the falling edge data drives, the data is always driven without contention. The rising edge of PASSE causes a piece of data to be passed from the data unit 101 that has passed through even mux 305 to the output register 102. This causes DQ to fall because the EVEN DATA is low in this example. PASSEd also fires on the rising edge of CK. PASSE signals a first buffer 306 to pass an even piece of data to the output register 102. PASSEd passes an even piece of data to the holding register 103. PASSE and PASSEd pass the same piece of data from the even data mux during single data rate operation. On the falling edge of CK or the rising edge of its complement CK*, a PASSF signal fires. The PASSF signal is sent to a fourth buffer 311 and causes the piece of data to be passed from the holding register 103 to the output register 102. Since the operation mode is single rate, PASSF does not cause the data in the output register 102 to change. PASSF operates on all falling edges of CK or rising edges of CK* and causes the contents of the holding register to be passed to the output register.

On the second cycle 702, PASSO is fired. The EVEN DATA is low and the ODD DATA is high in this example. The rising edge of PASSO causes a piece of data to be passed from the data unit 101 that has passed through the odd mux 304 to the output register 102. The PASSOd signal can fire shortly after the PASSO signal has fired but is substantially simultaneously fired with PASSO. PASSOd causes ODD DATA to be passed from the data unit 101 that has passed through the odd mux 304 the holding register 103. Since ODD DATA is high and has been passed to the output register 102, the DQ is shown going high. The PASSF signal fires again on the falling edge of CK or rising edge of CK* as above.

On the third cycle 703, a TRIPULSE signal is fired and presents a double zero to the output register. The TRIPULSE signal is fired to put the system in a high impedance state. The TRIPULSE signal is not required to be fired here but is fired in response to a user selection on a rising edge of CK. When the TRIPULSE signal is fired, the output register 102 goes to a double zero. A zero detector or some other means is used to cause the holding register 103 to go to a double zero. PASSE, PASSEd, PASSO and PASSOd do not fire when the TRIPULSE signal fires. The output register 102 remains in the double zero state when PASSF fires because the holding register 103 also is in the double zero state. The TRIPULSE signal can be fired whenever data is not being read to prevent DQ from being interpreted as being data.

On the fourth cycle 704, double data rate operation is entered. The DDR (double data rate) signal has gone from low to high in response to a user selection. PASSE fires and passes data from the data unit 101 that has passed through the even data mux 305 to the output register 102. However, unlike single data rate operation, PASSOd fires instead of PASSEd. ODD DATA is passed to the holding register. On the falling edge of CK or the rising edge of CK*, PASSF fires as it always does. However, since PASSOd fired instead of PASSEd, ODD DATA has been placed on the output register. Thus, DQ drops from high to low in this example.

On the fifth cycle 705, PASSO fires. PASSEd fires instead of PASSOd as in single data rate operation. ODD DATA is passed from the data unit 101 to the output register 102 and EVEN DATA is passed from the data unit 101 to the holding register 103. On the falling edge of CK or the rising edge of CK*, PASSF fires and places the EVEN DATA on the output register from the holding register.

On the sixth cycle 706, the TRIPULSE is fired so the output register is in a double zero state.

CONCLUSION

The present invention has practical applications in many types of electronic systems. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A device comprising:
   a data unit;
   an output register connected to the data unit;
   a holding register connected to the data unit and the output register for receiving data from the data unit and for transferring the data to the output register;
   an output buffer connected to the output register and the holding register; and
   a selection mechanism connected to the output register and the holding register for selecting a data rate between a first data rate and a second data rate for data outputted at the output buffer.

2. The device of claim 1, wherein in the first data rate, the output buffer is configured to receive a first piece of data from the output register on a first edge of a clock signal and configured to receive a second piece of data from the holding register on a second edge of the clock signal.

3. The device of claim 2, wherein in the second data rate, the output buffer is configured to receive the first piece of data from the output register on the first edge of the clock signal and configured to receive from the holding register a piece of data having the same data as the first piece of data on the second edge of the clock signal.

4. The device of claim 3, wherein the output register is configured to receive the first piece of data from the data unit on the first edge of the clock signal, and the output register is configured to receive the second piece of data from the holding register on the second edge of the clock signal.

5. The device of claim 3, wherein the output register is configured to receive the first piece of data from the data unit on a first event, and the holding register is configured to receive the second piece of data from the data unit on a second event.

6. A device comprising:
   a data unit;
   a first path connected to the data unit;
   a second path connected to the data unit;
   an output register connected to the first path and the second path;
   a holding register connected to the first path, the second path, and the output register for receiving data from the data unit and for transferring the data to the output register;
   an output buffer connected to the output register and the holding register;
   a selection mechanism connected to the output register and the holding register for selecting a data rate between a single data rate and a double data rate;
   wherein in the double data rate, the output register is configured to receive a first piece of data from the first path on a first edge of a clock signal and configured to receive a second piece of data from the holding register on a second edge of the clock signal; and
   wherein in the single data rate, the output register is configured to receive the first piece of data from the first path on the first edge of the clock signal and configured to receive the first piece data from the holding register on the second edge of the clock signal.

7. The device of claim 6, wherein the first path is configured to select data from a first portion of data of the data unit for passing the first portion of data to one of the holding register and the output register.

8. The device of claim 6, wherein the second path is configured to select data from a second portion of data of the data unit for passing the second portion of data to one of the output register and the holding register.

9. A device comprising:
   a data unit;
   a first path connected to the data unit;
   a second path connected to the data unit;
   an output register connected to the first path and the second path for receiving data from one of the first path and the second path on a first edge of a clock signal;
   a holding register connected to output register, the first path and the second path for receiving data from one of the first path and the second path on the first edge of a clock signal and for passing the data to the output register on a second edge of the clock signal; and
   an output buffer connected to the output register and the holding register.

10. A device comprising:
    a data unit;
    a first path connected to the data unit;
    a second path connected to the data unit;
    an output register connected to the first path and the second path for receiving data from one of the first path and the second path on a first edge of a clock signal;
    a holding register connected to output register, the first path and the second path for receiving data from one of the first path and the second path on the first edge of a clock signal and for passing the data to the output register on a second edge of the clock signal;
    an output buffer connected to the output register and the holding register; and
    a buffer for placing a double zero into the output register and the holding register to indicate no data present.

11. The device of claim 9, wherein the data unit is a disk drive.

12. The device of claim 9, wherein the data unit includes memory cells.

13. A device comprising:
    a data unit including a first range of data and a second range of data;
    a first multiplexor (mux) connected to the data unit for selecting the first range of data;
    a second mux connected to the data unit for selecting the second range of data;
    an output register connected to the first mux and the second mux for receiving data from the data unit;
    a holding register connected to the first mux and the second mux for receiving data from the data unit and for passing the data to the output register;
    an output buffer connected to the output register; and
    a tripulse buffer connected to the output register for placing a double zero into the output register and the holding register to place the output buffer into a tri-state condition.

14. The device of claim 13, wherein the data unit includes a memory array having first addresses for holding the first range of data and having second addresses for holding the second range of data.

15. A device comprising:
    a data unit;

an output register connected to the data unit;

a holding register connected to the data unit and the output register for receiving data from the data unit and for transferring the data to the output register;

an output buffer connected to the output register and the holding register;

a select pin connected to the output register and the holding register for selecting a data rate between a first data rate and a second data rate;

wherein in the first data rate, the output register is configured to receive a first piece of data from the data unit on a first edge of a clock signal and configured to receive a second piece of data from the holding register on a second edge of the clock signal; and wherein in the second data rate, the output register is configured to receive the first piece of data from the data unit on the first edge of the clock signal and configured to receive from the holding register a piece of data having the same data as the first piece of data on the second edge of the clock.

16. The device of claim 15, wherein the output register is configured to receive the first piece of data from the data unit on a first event, and the output register is configured to receive the second piece of data from the holding register on a second event.

17. The device of claim 15, wherein in the first data rate, the output register is configured to receive the first piece of data from one memory location in the data unit, and the holding register is configured to receive the second piece of data from another memory location in the data unit.

18. The device of claim 17, wherein in the second data rate:

the output register is configured to receive the first piece of data from a particular memory location in the data unit, and the holding register is configured to receive the second piece of data of data from the particular memory location.

19. A system comprising:

a processor;

a data unit having memory cells;

an output register connected to the data unit;

a holding register connected to the data unit and the output register for receiving data from the data unit and for transferring the data to the output register;

an output buffer connected to the output register and the holding register for outputting data from the memory cells to the processor; and a selection mechanism connected to the output register and the holding register for selecting a data rate between a first data rate and a second data rate for data outputted at the output buffer.

20. The system of claim 19, wherein in the first data rate, the output buffer is configured to receive a first piece of data from the output register on a first edge of a clock signal and configured to receive a second piece of data from the holding register on a second edge of the clock signal.

21. The system of claim 20, wherein in the second data rate, the output buffer is configured to receive the first piece of data from the output register on the first edge of the clock signal and configured to receive from the holding register a piece of data having the same data as the first piece of data on the second edge of the clock signal.

22. The system of claim 21, wherein the output register is configured to receive the first piece of data from the data unit on the first edge of the clock signal, and the output register is configured to receive the second piece of data from the holding register on the second edge of the clock signal.

23. The system of claim 21, wherein the output register is configured to receive the first piece of data from the data unit on a first event, and the holding register is configured to receive the second piece of data from the data unit on a second event.

24. A method comprising:

selecting a data rate among multiple data rates for transferring data;

transferring a first piece of data to an output register on a first edge of a clock signal;

outputting the first piece of data from the output register to an output buffer;

transferring a second piece of data to a holding register on the first edge of the clock signal;

transferring the second piece of data from the holding register to the output register on a second edge of the clock signal; and outputting the second piece of data from the output register to the output buffer.

25. The method of claim 24, wherein:

selecting a data rate among multiple data rates includes selecting the data rate between a first data rate and a second data rate different from the first data rate; and in the first data rate, the first piece of data and the second piece of data are transferred from different memory locations.

26. The method of claim 25, wherein in the second data rate, the first piece of data and the second piece of data are transferred from the same memory location.

27. The method of claim 25, wherein the first piece of data and the second piece of data are transferred simultaneously from the different memory locations.

28. A method comprising:

selecting a data rate among multiple data rates for transferring data;

passing a first piece of a first data set to an output register;

passing a first piece of a second data set to the holding register;

outputting the first piece of the first data set from the output register to an output buffer;

passing the first piece of the second data set from the holding register to the output register;

outputting the first piece of the second data set from the output register to the output buffer;

passing a second piece of the first data set to the output register;

passing a second piece of the second data set to a holding register;

outputting the second piece of the first data set from the output register to the output buffer;

passing the second piece of the second data set from the holding register to the output register; and outputting the second piece of the second data set from the output register to the output buffer.

29. The method of claim 28, wherein the first data set and the second data set are located in a memory array.

30. The method of claim 28, wherein passing a first piece of a first data set to an output register and passing a first piece of a second data set to the holding register occur simultaneously.

31. The method of claim 28, wherein passing a second piece of the first data set to the output register and passing a second piece of the second data set to the holding register occur simultaneously.

32. The method of claim 28, wherein:
  selecting a data rate includes selecting the data rate between a first data rate and a second data rate different from the first data rate; and
  in the first data rate, the first piece of the first data set and the first piece of the second data set are located in different memory locations.

33. The method of claim 32, wherein the second piece of the first data set and the second piece of the second data set are located in different memory locations.

34. The method of claim 32, wherein in the second data rate, the first piece of the first data set and the first piece of the second data set are located in the same memory location.

35. The method of claim 34, wherein the second piece of the first data set and the second piece of the second data set are located in the same memory location.

36. A method comprising:
  selecting a data rate among multiple data rates for transferring data;
  transferring a first data bit from a data array to an output register;
  transferring a second data bit from the data array to a holding register;
  passing the second data bit from the holding register to the output register;
  transferring a first subsequent data bit from the data array to the output register,
  transferring a second subsequent data bit from the data array to the holding register;
  passing the second subsequent data bit from the holding register to the output register; and
  outputting from the output register to an output buffer the first data bit, the subsequent first data bit, the second data bit, and the subsequent second data bit on consecutive edges of a clock signal.

37. The method of claim 36, wherein selecting a data rate includes selecting the data rate between a first data rate and a second data rate, the first data rate having a rate twice a rate of the second data rate.

38. The method of claim 36, wherein transferring a first data bit and transferring a second data bit occur simultaneously.

39. The method of claim 36, wherein transferring a first subsequent data bit and transferring a second subsequent data bit occur simultaneously.

40. The method of claim 36, wherein:
  selecting a data rate includes selecting the data rate between a first data rate and a second data rate different from the first data rate; and
  in the first data rate, the first data bit and the first subsequent data bit are located in different memory locations.

41. The method of claim 40, wherein the second data bit and the second subsequent data bit are located in different memory locations.

42. The method of claim 40, wherein in the second data rate, the first data bit and the first subsequent data bit are located in the same memory location.

43. The method of claim 42, wherein the second data bit and the second subsequent data bit are located in the same memory location.

* * * * *